(12) United States Patent
Kitagawa

(10) Patent No.: US 11,817,419 B2
(45) Date of Patent: Nov. 14, 2023

(54) BONDING HEAD WITH LARGE AND SMALL SPRAY APERTURES

(71) Applicant: SHIBUYA CORPORATION, Kanazawa (JP)

(72) Inventor: Masato Kitagawa, Kanazawa (JP)

(73) Assignee: SHIBUYA CORPORATION, Kanazawa (JP)

( * ) Notice: Subject to any disclaimer, the term of this patent is extended or adjusted under 35 U.S.C. 154(b) by 0 days.

(21) Appl. No.: 17/734,556

(22) Filed: May 2, 2022

(65) Prior Publication Data
US 2022/0367404 A1 Nov. 17, 2022

(30) Foreign Application Priority Data

May 11, 2021 (JP) ................................ 2021-080272

(51) Int. Cl.
| H01L 23/00 | (2006.01) |
| B23K 3/08 | (2006.01) |
| B23K 1/005 | (2006.01) |
| B23K 101/40 | (2006.01) |

(52) U.S. Cl.
CPC ............ *H01L 24/75* (2013.01); *B23K 1/0056* (2013.01); *B23K 3/08* (2013.01); *B23K 2101/40* (2018.08); *H01L 2224/75261* (2013.01); *H01L 2224/75745* (2013.01); *H01L 2224/75984* (2013.01)

(58) Field of Classification Search
CPC ............... B23K 1/0016; B23K 1/0056; B23K 2101/40; B23K 3/08; B23K 3/087; H01L 2224/75261; H01L 2224/75745; H01L 24/75; H01L 2224/75984
See application file for complete search history.

(56) References Cited

U.S. PATENT DOCUMENTS

| 5,309,545 A * | 5/1994 | Spigarelli | B23K 1/0053 |
| | | | 392/419 |
| 5,320,273 A * | 6/1994 | Goenka | B23K 3/085 |
| | | | 228/52 |
| 5,419,481 A * | 5/1995 | Lasto | B23K 1/018 |
| | | | 228/264 |
| 5,553,768 A * | 9/1996 | Lasto | B23K 1/012 |
| | | | 228/9 |

(Continued)

FOREIGN PATENT DOCUMENTS

| JP | 10214864 A * | 8/1998 |
| JP | 2011108990 A | 6/2011 |
| JP | 2015153807 A | 8/2015 |

*Primary Examiner* — Erin B Saad
*Assistant Examiner* — Carlos J Gamino
(74) *Attorney, Agent, or Firm* — FLYNN THIEL, P.C.

(57) ABSTRACT

A bonding apparatus provided with a gas supplying unit for causing an inert gas to be sprayed from a spray aperture provided adjacent to a holding section of the bonding head. The spray aperture is provided so as to surround the holding section of the bonding head, in which a portion of the slits is a wide slit set to a higher jet flow rate of the inert gas than narrow slits of another portion, and the inert gas sprayed from the wide slit and the narrow slits forms an air curtain that surrounds the bonding portion between the semiconductor chip and the substrate. The inert gas sprayed from the wide slit forms a flow that passes between the semiconductor chip and the substrate.

3 Claims, 4 Drawing Sheets

(56) References Cited

U.S. PATENT DOCUMENTS

| | | | | |
|---|---|---|---|---|
| 5,560,531 | A | * | 10/1996 | Ruszowski ............ B23K 1/008 228/264 |
| 5,785,237 | A | * | 7/1998 | Lasto ..................... B23K 1/018 228/19 |
| 6,102,273 | A | * | 8/2000 | Satoh ...................... H01L 24/75 228/6.2 |
| 6,105,847 | A | * | 8/2000 | Kim .................. H05K 13/0486 228/49.5 |
| 6,182,884 | B1 | * | 2/2001 | Ma ........................ B23K 1/012 228/264 |
| 6,257,478 | B1 | * | 7/2001 | Straub ............... H05K 13/0486 228/264 |
| 6,378,753 | B1 | * | 4/2002 | Schellen ............... B23K 1/085 228/42 |
| 8,220,691 | B2 | | 7/2012 | Kajii |
| 9,302,277 | B2 | * | 4/2016 | Davis, Jr. ............... B23K 1/018 |
| 2003/0164396 | A1 | * | 9/2003 | Suga ..................... B23K 1/206 257/E21.511 |
| 2004/0050685 | A1 | * | 3/2004 | Yara .................... C23C 16/4412 422/186.04 |
| 2004/0169020 | A1 | * | 9/2004 | Yamauchi ........... H01L 21/4864 219/121.46 |
| 2009/0145546 | A1 | * | 6/2009 | Inamoto ................. H01L 24/81 156/272.6 |
| 2011/0121055 | A1 | * | 5/2011 | Kajii ................. B23K 37/0408 228/49.5 |
| 2013/0153645 | A1 | * | 6/2013 | Owens ............. H01L 27/14636 228/180.22 |

* cited by examiner

BONDING HEAD WITH LARGE AND SMALL SPRAY APERTURES

FIELD OF THE INVENTION

The present invention relates to a bonding apparatus, and more particularly, to a bonding apparatus provided with a gas supplying unit for replacing air around a bonding portion between a semiconductor chip and a substrate with an inert gas when bonding the semiconductor chip to the substrate.

DESCRIPTION OF THE RELATED ART

In the related art, a bonding apparatus that bonds a semiconductor chip to a substrate is known, the bonding apparatus being provided with a bonding head including a holding section that holds the semiconductor chip, and a bonding stage that supports the substrate.

Here, in the case of a bonding apparatus that bonds a semiconductor chip to a substrate using heat, to prevent bonding defects from occurring due to the oxidation of the bonding portion between the semiconductor chip and the substrate, the air around the bonding portion is replaced by an inert gas (refer to Japanese Laid-Open Patent Application Nos. 2011-108990 and 2015-153807).

In the bonding apparatuses of Japanese Laid-Open Patent Application Nos. 2011-108990 and 2015-153807, spray apertures that spray an inert gas are provided on the bonding head that holds the semiconductor chip, and are configured to form an air curtain around the bonding portion and fill the inner side of the air curtain with the inert gas.

SUMMARY OF THE INVENTION

However, in the bonding apparatuses of Japanese Laid-Open Patent Application Nos. 2011-108990 and 2015-153807, since inert gas is sprayed at the same jet flow rate from the spray apertures surrounding the semiconductor chip, stagnation of the inert gas occurs in the central portion of the air curtain, and oxygen-containing air remaining in this portion cannot be eliminated completely in some cases.

In light of such a problem, a bonding apparatus that can replace the air around the bonding portion between the semiconductor chip and the substrate with inert gas at a high level is provided.

Namely, a bonding apparatus according to one aspect of the invention includes a bonding stage that holds a substrate; a bonding head provided with a holding section that holds a semiconductor chip; a spray aperture provided adjacent to the holding section of the bonding head; and a gas supplying unit for causing an inert gas to be sprayed from the spray aperture, the spray aperture is provided so as to surround the holding section of the bonding head, and a portion of the spray aperture is a large spray aperture set to a larger jet flow rate of the inert gas than a small spray aperture of another portion, and the inert gas sprayed from the large spray aperture and the small spray aperture forms an air curtain that surrounds a bonding portion between the semiconductor chip and the substrate, and the inert gas sprayed from the large aperture forms a flow that passes between the semiconductor chip and the substrate.

According to the above invention, an air curtain can be formed around the bonding portion between the semiconductor chip and the substrate by a spray aperture provided so as to surround the holding section of the bonding head, and the flow of air into the inner side of the air curtain can be prevented.

Furthermore, by configuring a portion of the spray apertures as a large spray aperture having a high jet flow rate, the inert gas flowing out from the large spray aperture passes between the semiconductor chip and the substrate and forms a flow proceeding toward the small spray aperture.

As a result, air between the semiconductor chip and the substrate can be eliminated by the flow of the inert gas, and by replacing the air at the bonding portion with the inert gas at a high level, the oxidation of the bonding portion can be prevented.

DETAILED DESCRIPTION OF THE PREFERRED EMBODIMENTS

Figure 1:
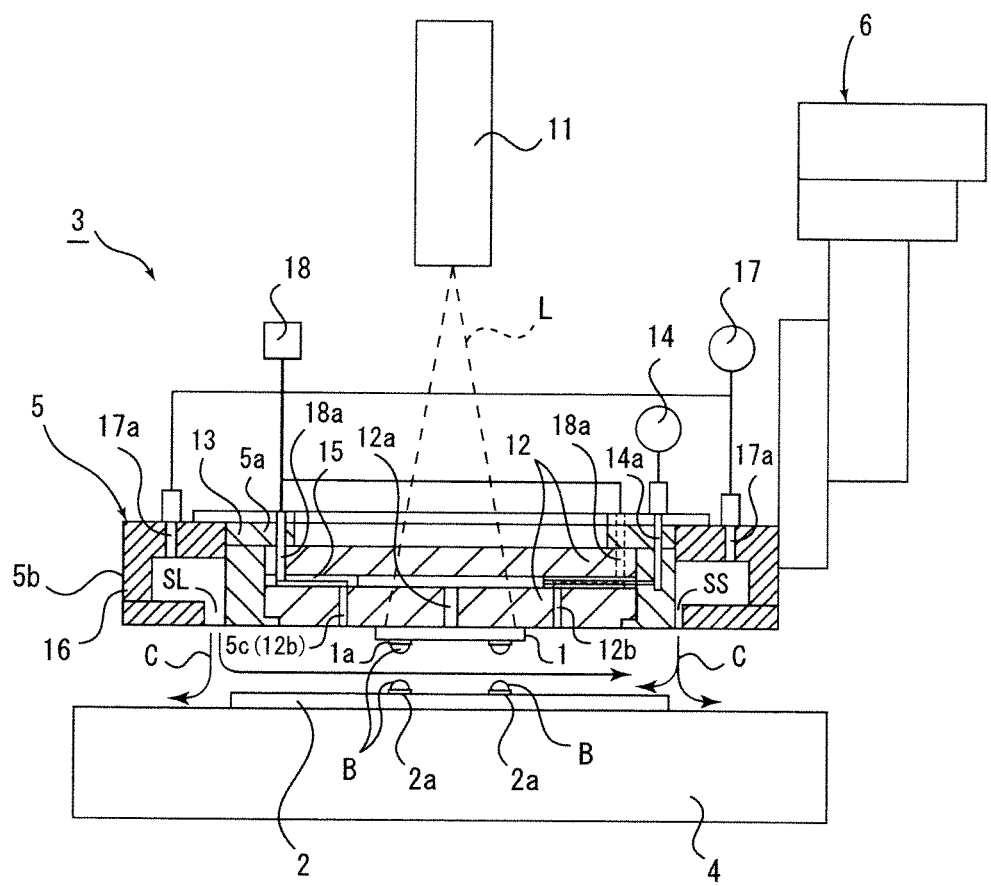
FIG. 1 is a cross section of a bonding apparatus according to an embodiment.

Hereinafter, to describe the illustrated embodiments, FIG. 1 illustrates a bonding apparatus 3 that bonds a semiconductor chip 1 to a substrate 2 and is provided with a bonding stage 4 that supports the substrate 2, a bonding head 5 including a holding section 5a that holds the semiconductor chip 1, and a movement unit 6 for moving the bonding head 5, these components being controlled by controlling unit not illustrated.

Figure 2:
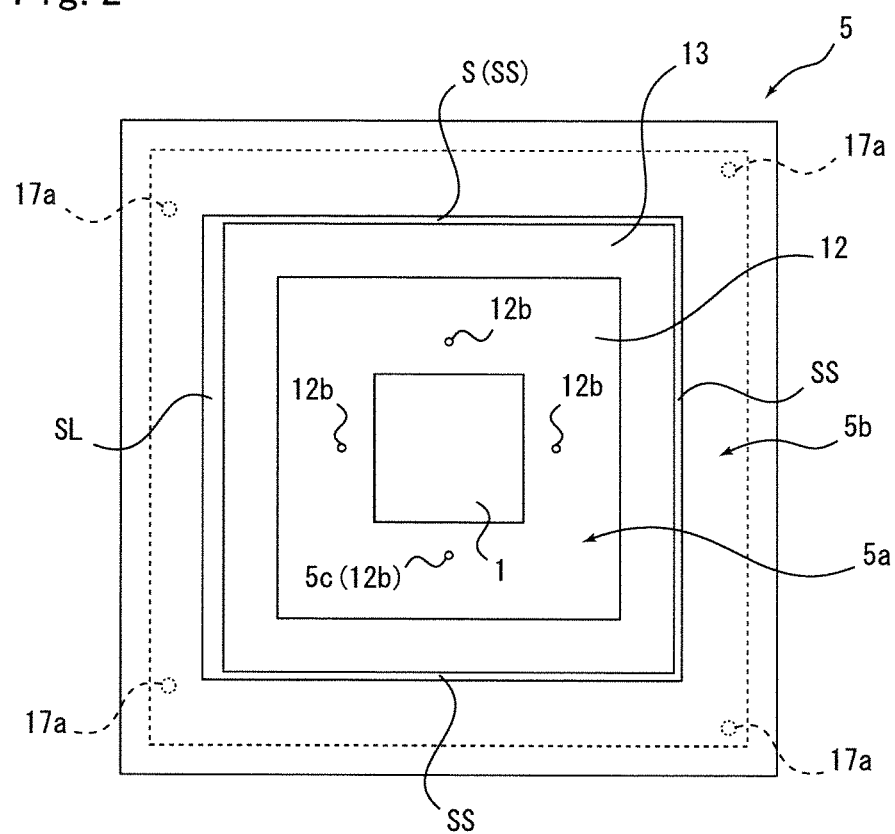
FIG. 2 is a view of a bonding head as seen from below.

The semiconductor chip 1 is approximately square as illustrated in FIG. 2, a plurality of electrodes 1a are provided on the back surface of the semiconductor chip 1, and a bump B of solder is also formed on each electrode 1a.

In addition, the substrate 2 is formed larger than the semiconductor chip 1, electrodes 2a are formed at certain locations on the front surface of the substrate 2 in the same arrangement as the electrodes 1a on the semiconductor chip 1, and a bump B of solder is formed on each electrode 2a.

Furthermore, the bonding head 5 holding the semiconductor chip 1 is moved by the movement unit 6, and when the semiconductor chip 1 is positioned close to a certain location on the substrate 2 supported on the bonding stage 4, the bumps B are melted to bond the semiconductor chip 1 to the substrate 2.

The bonding stage 4 has a wider area than the substrate 2, and holds the substrate 2 on its upper surface by suction provided by a suction unit (not illustrated). Note that an X-Y table for moving the bonding stage 4 horizontally may also be provided as the movement unit 6, instead of moving the bonding head 5.

The bonding head 5 includes, inside a housing (not illustrated), a laser light irradiating unit 11 for irradiating the semiconductor chip 1 with laser light L.

In addition to the holding section 5a that holds the semiconductor chip 1 by suction via negative pressure, a spraying unit 5b is provided around the holding section 5a and forms an air curtain C of an inert gas, and a measurement unit 5c that measures the oxygen concentration inside the air curtain C are provided in a lower portion of the housing.

The laser light irradiating unit 11 emits the laser light L downward, and by irradiating the semiconductor chip 1 held by suction on the bottom surface of the holding section 5a with the laser light L, the bumps B formed on the electrodes 1a and 1b of the semiconductor chip 1 and the substrate 2 are melted.

Note that instead of the laser light irradiating unit 11, known heating unit such as a pulse heater may also be used to melt the bumps B formed on the electrodes 1a and 1b of the semiconductor chip 1 and the substrate 2.

The movement unit 6 is configured to move the bonding head 5 horizontally (X-Y directions) and also raise or lower the bonding head 5 vertically (Z direction), and furthermore is provided with a rotation mechanism for rotating the bonding head 5 together with the semiconductor chip 1.

The holding section 5a is provided with two transparent plates 12 and a holder 13 that holds the peripheral portions of the plates 12, and in addition, a negative pressure supplying unit 14 that supplies negative pressure is connected to the holding section 5a.

The two plates 12 include a transparent material such as quartz or glass that transmits the laser light L from the laser light irradiating unit 11, are approximately square and have a larger area than the semiconductor chip 1 as illustrated in FIG. 2.

Between the two plates 12, a spacer 15 is provided in an endless shape along the outer periphery of the plates 12, thereby creating a space between the two plates 12.

The holder 13 is provided so as to surround the two plates 12 and the spacer 15, and to allow the laser light L emitted by the laser light irradiating unit 11 to be transmitted through the two plates 12 from above to below.

Also, a negative pressure passage 14a connecting to the negative pressure supplying unit 14 is formed in the holder 13 and the spacer 15, and a negative pressure supplied through the negative pressure passage 14a flows into the space formed between the plates 12.

A through-hole 12a is formed vertically in the approximate center of the lower one of the two plates 12, and when the semiconductor chip 1 is positioned at the position of the through-hole 12a, the negative pressure supplied to the space causes the semiconductor chip 1 to be suctioned onto the bottom surface of the plate 12.

In addition, the negative pressure supplying unit 14 is controlled by the controlling unit, and by controlling the supply of negative pressure, it is possible to hold or release the semiconductor chip 1 by suction.

The spraying unit 5b includes a frame 16 surrounding the outer circumference of the holder 13 forming the holding section 5a, and the frame 16 has an approximately U-shaped cross section in which the open part of the U shape faces inward.

With this configuration, a space surrounding the holder 13 in an endless shape is formed between the frame 16 and the outer circumferential surface of the holder 13, and gas supplying unit 17 is connected to the space through gas passages 17a formed in the frame 16.

The gas supplying unit 17 supplies an inert gas such as nitrogen gas to keep bonding defects from occurring due to oxidation when bonding the semiconductor chip 1 to the substrate 2.

In the present embodiment, the gas passages 17a are provided at the four corners of the frame 16 as illustrated in FIG. 2, and the gas supplying unit 17 is connected to each of the gas passages 17a through branch piping.

Additionally, in the lower part of the frame 16, slits S are formed as spray apertures between the frame 16 and the outer circumferential surface of the holder 13, and by connecting the slits S to the space formed on the inner side of the frame 16, the inert gas supplied to the space is sprayed downward.

As illustrated in FIG. 2, the slits S are provided at positions corresponding to each edge of the approximately square holding section 5a, and more specifically, are formed endlessly in an approximately square shape along the outer periphery of the holder 13.

Additionally, in the bonding apparatus 3 of the present embodiment, the one slit S located on the left side of the drawing is a wide slit SL and is configured as a large spray aperture, while the other three slits S are narrow slits SS and are configured as small spray apertures.

In the present embodiment, the width of the wide slit SL is set to 5 mm while the width of the narrow slits SS set to 0.5 mm, such that the area of the opening in the wide slit SL is approximately 10 times that of the narrow slits SS.

By adopting such a configuration, the inert gas supplied by the gas supplying unit 17 from the wide slit SL can be sprayed at a larger jet flow rate than the narrow slits SS.

Here, in the present embodiment, since the jet flow rate of the inert gas from the wide slit SL is greater than the jet flow rate of the narrow slits SS, with respect the gas passages 17a formed on the frame 16, the two gas passages 17a neighboring the wide slit SL (in FIG. 2, the two located on the left side of the diagram) are provided at positions close to the wide slit SL.

The measurement unit 5c uses an oxygen concentration measuring unit 18 to measure whether or not the air around the semiconductor chip 1 held by the holding section 5a has been replaced by the inert gas.

In the lower plate 12 of the holding section 5a, four suction ports 12b are formed around the semiconductor chip 1 held by suction, and the suction ports 12b are connected to the oxygen concentration measuring unit 18 through measurement passages 18a formed in the upper plate 12 and the spacer 15.

The oxygen concentration measuring unit 18 suctions air in the space below the holding section 5a from the suction ports 12b and also measures the oxygen concentration in the suctioned air, and on the basis of the measurement result, the controlling unit determines whether or not the air around the semiconductor chip 1 has been replaced by the inert gas.

In the case of determining that the air around the semiconductor chip 1 has not been sufficiently replaced by the inert gas, the controlling unit controls the movement unit 6 to narrow the spacing between the bonding head 5 and the bonding stage 4, or increases the quantity of the inert gas sprayed by the gas supplying unit 17.

At this point, it is possible for the oxygen concentration measuring unit 18 to suction air at the same time from the four suction ports 12b formed around the semiconductor chip 1 and to take a unified measurement of the oxygen concentration around the semiconductor chip 1, but it is also possible for the oxygen concentration measuring unit 18 to use a switching valve or the like to suction air individually from each suction port 12b and take a pinpoint measurement of the oxygen concentration around each suction port 12b.

Note that in the present embodiment, a total of four suction ports 12b are provided adjacent to each edge of the semiconductor chip 1 held by suction, but the positions and number of the suction ports 12b may be changed as appropriate insofar as the suction ports 12b are formed inside the range where the holding section 5a is formed and at positions that do not hinder the suctioning of the semiconductor chip 1.

Hereinafter, to describe operations by the bonding apparatus 3 having the above configuration, first, the controlling unit causes the movement unit 6 to move the bonding head 5 to a chip supplying unit (not illustrated), and the bonding head 5 holds the semiconductor chip 1 against the holding section 5a by suction due to the negative pressure from the negative pressure supplying unit 14.

On the other hand, the controlling unit uses a substrate supplying unit (not illustrated) to supply the substrate 2 to a certain position on the bonding stage 4, and the bonding stage 4 holds the substrate 2 by suction.

Next, the controlling unit uses an image-capturing unit (not illustrated) to capture an image of the semiconductor chip 1 held by suction on the bonding head 5 and the substrate 2 held on the bonding stage 4, and recognizes the relative positional relationship between the two.

Thereafter, the controlling unit causes the movement unit 6 to move the bonding head 5 above the bonding stage 4, and at this time makes fine adjustments to the horizontal position of the semiconductor chip 1 and rotates the semiconductor chip 1 in the horizontal plane, such that the positions of the electrodes 1a on the semiconductor chip 1 match the positions of the electrodes 2a on the substrate 2.

FIG. 1 illustrates a state in which the semiconductor chip 1 held by the bonding head 5 is positioned above a bonding location for the semiconductor chip 1 on the substrate 2 supported on the bonding stage 4 (for example, a position at which the size of the gap between the bonding head 5 and the bonding stage 4 is 5 mm).

When the semiconductor chip 1 is positioned above the bonding location on the substrate 2, the controlling unit causes the gas supplying unit 17 to supply the inert gas, and the inert gas is supplied into the space formed inside the frame 16 through the gas passages 17a and is sprayed downward from the slits S acting as spray apertures formed in the gap between the frame 16 and the holder 13.

As illustrated in FIG. 2, the inert gas sprayed from the slits S collides with the surface of the substrate 2 and the bonding stage 4 positioned below the substrate 2, and flows so as to spread out along the substrate 2 and the bonding stage 4.

The slits S are provided to surround the holding section 5a, and therefore the sprayed inert gas forms an air curtain C of laminar flow surrounding the bonding location of the semiconductor chip 1 held by suction on the holding section 5a and the substrate 2.

In the present embodiment, since the slits S are provided to surround the holding section 5a in an endless shape, the air curtain C can be formed in an uninterrupted way.

By forming the air curtain C, air from the outside of the air curtain C can be prevented from flowing in, thereby keeping the bonding portion from oxidizing when bonding the semiconductor chip 1 to the substrate 2.

Moreover, the inert gas flowing in between the bonding head 5 and the bonding stage 4 fills the space between the semiconductor chip 1 and the substrate 2, thereby driving out oxygen that had been present in the space.

Additionally, in the bonding apparatus 3 of the present embodiment, one of the four slits S surrounding the holding section 5a is a wide slit SL configured as a large spray aperture, while the others are narrow slits SS configured as small spray apertures.

By adopting such a configuration, as illustrated in FIG. 1, the inert gas flowing from the wide slit SL with a high jet flow rate on the inner side of the air curtain C flows toward the narrow slits SS with a low jet flow rate provided at positions across from the wide slit SL with the semiconductor chip 1 in between, thereby forming a mainstream laminar flow cutting across the semiconductor chip 1 below the bonding head 5.

In particular, in the state where the semiconductor chip 1 held by the bonding head 5 is positioned above the substrate 2, the flow (mainstream) of the inert gas passes between the semiconductor chip 1 and the substrate 2, and therefore oxygen-containing air that had been present can be eliminated at a high level.

In contrast, if the jet flow rates of the inert gas from the four slits S surrounding the holding section 5a are equal, the inert gas sprayed into the inner side of the air curtain C will stagnate in the central portion of the air curtain C, or in other words between the semiconductor chip 1 and the substrate 2, and the oxygen-containing air that had been present may not be eliminated in some cases.

In this way, when the air between the semiconductor chip 1 and the substrate 2 is replaced by the inert gas, the controlling unit controls the laser light irradiating unit 11 to irradiate the semiconductor chip 1 with the laser light L and thereby melt the bumps B on the semiconductor chip 1, and by subsequently lowering the bonding head 5, the semiconductor chip 1 is brought close to the substrate 2.

When the semiconductor chip 1 is brought close to the substrate 2, the emission of the laser light L from the laser light irradiating unit 11 is stopped, after which the molten bumps B cool and solidify, and the semiconductor chip 1 is bonded to the substrate 2. Thereafter, the controlling unit stops the supply of negative pressure from the negative pressure supplying unit 14 and raises the bonding head 5 to separate same from the semiconductor chip 1.

Note that the laser light irradiating unit 11 may irradiate and preheat the semiconductor chip 1 with the laser light L while the inert gas is being sprayed from the spray apertures to form the air curtain C and the mainstream, or the laser light irradiating unit 11 may emit the laser light L in the state in which the bonding head 5 has been lowered and the semiconductor chip 1 is close to the substrate 2.

At this point, when the air between the semiconductor chip 1 and the substrate 2 is replaced by the inert gas, it is necessary to appropriately set factors such as the gap size between the bonding head 5 and the bonding stage 4 illustrated in FIG. 1 and the flow rate of the inert gas sprayed by the spraying unit 5b from the gas supplying unit 17.

For example, if a wide gap is set, the mainstream flowing from the wide slit SL to the narrow slits SS is formed easily, but there is an increased possibility of the intrusion of air from outside the air curtain C.

Also, if a high flow rate of the inert gas to be sprayed from the spraying unit 5b is set, the replacement ratio of the inert gas on the inner side of the air curtain C is raised, but the semiconductor chip 1 and the substrate 2 are also cooled by the inert gas, which may lead to increased apparatus costs, such as the need to add a heating unit for heating the inert gas.

Accordingly, in the bonding apparatus 3 of the present embodiment, the oxygen concentration on the inner side of the air curtain C is measured by the oxygen concentration measuring unit 18, and if the controlling unit has determined that the oxygen concentration on the inner side of the air curtain C has not reached the desired concentration, the replacement by the inert gas is determined to be insufficient.

In this case, the controlling unit performs a feedback control that causes the movement unit 6 to lower the bonding head 5 and decrease the gap size, and also increases the flow rate of the inert gas from the gas supplying unit 17.

At this time, preferred ranges of values for the gap size and the inert gas flow rate may be preset, and the controlling unit may change at least one of the gap size or the flow rate on the basis of the set values.

Alternatively, instead of performing a feedback control, a preferred gap size and flow rate may be preregistered in the controlling unit for each type of semiconductor chip 1 and substrate 2, and when bonding corresponding types with the bonding apparatus 3, the gap size and the flow rate may be selected according to an automatic type discrimination performed using the image-capturing unit or by manual selection performed by an operator.

Hereinafter, FIGS. 3 to 7 illustrate the bonding apparatus 3 according to second to sixth embodiments in all of which the shape of the spray apertures provided in the bonding head 5 is different from the first embodiment. Note that in the following embodiments, the suction ports 12b are likewise used to measure the oxygen concentration on the inner side of the air curtain C, but a description of this configuration is omitted.

Figure 3:
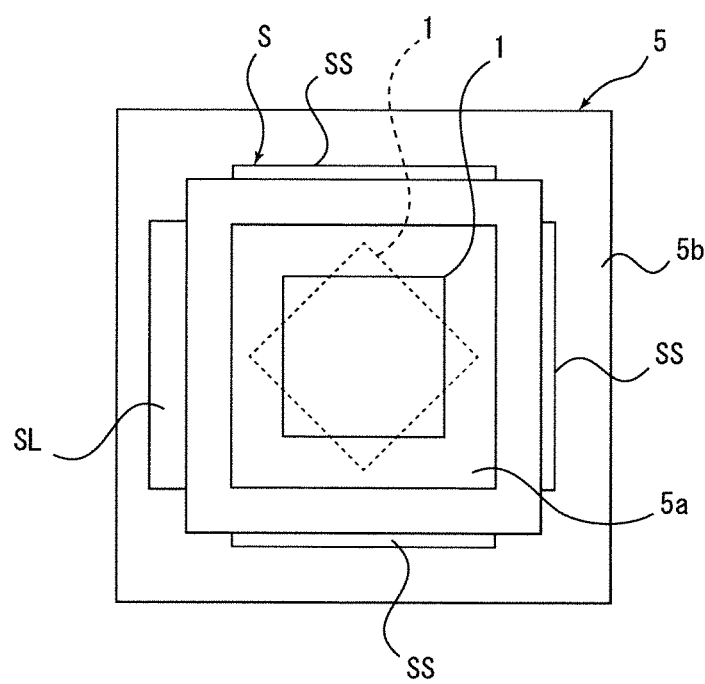
FIG. 3 is a diagram for explaining the arrangement of spray apertures in a second embodiment.

In the bonding apparatus 3 of the second embodiment illustrated in FIG. 3, the holding section 5a of the bonding head 5 is likewise approximately square, and the spray apertures in the present embodiment likewise include four slits S provided along the holding section 5a.

Likewise, in the present embodiment, one of the slits S is a wide slit SL while the other three are narrow slits SS, but unlike the first embodiment, the ends of the slits S are not connected to one another, and the slits S are independent from each other without surrounding the holding section 5a in an endless shape.

However, the wide slit SL and the narrow slits SS are set in accordance with the width of the semiconductor chip 1 held by suction on the holding section 5a, such that even if the semiconductor chip 1 is held in a rotated state on the inner side of the holding section 5a as indicated by the dashed lines, roughly the same length from end to end is secured.

By adopting such a configuration, similarly to the first embodiment, a flow of the inert gas sprayed from the wide slit SL can be formed between the semiconductor chip 1 and the substrate 2, and the air between the semiconductor chip 1 and the substrate 2 can be replaced by the inert gas at a high level.

Note that in the present embodiment, the neighboring slits S are not joined to each other and do not surround the holding section 5a in an endless shape, but since the lengths of the slits S are provided in accordance with the length of the semiconductor chip 1 from end to end, the air curtain C can be formed around the semiconductor chip 1.

Figure 4:
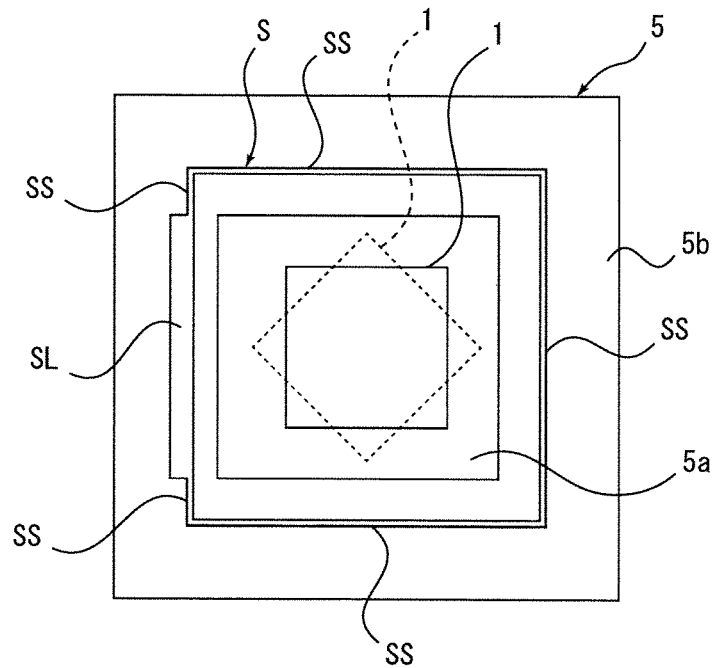
FIG. 4 is a diagram for explaining the arrangement of spray apertures in a third embodiment.

The bonding apparatus 3 of the third embodiment illustrated in FIG. 4 is provided with four slits S along the holding section 5a, but compared to the bonding apparatus 3 in the second embodiment, the ends of the slits S provided along the holding section 5a are connected to one another, and the holding section 5a is surrounded by an endless shape.

On the other hand, in the present embodiment, unlike the bonding apparatus 3 in the first embodiment, the slit S formed as the wide slit SL is provided such the wide slit SL is formed to an extent in accordance with the width over which the semiconductor chip 1 is held, and the narrow slits SS are formed on either side of the wide slit SL.

By adopting such a configuration, by providing the wide slit SL to the extent to which the semiconductor chip 1 is held, it is possible to make the flow of the inert gas be concentrated in the range over which the semiconductor chip is held, and furthermore, joining the slits to each other makes it possible to form the air curtain C in an uninterrupted way.

Figure 5:
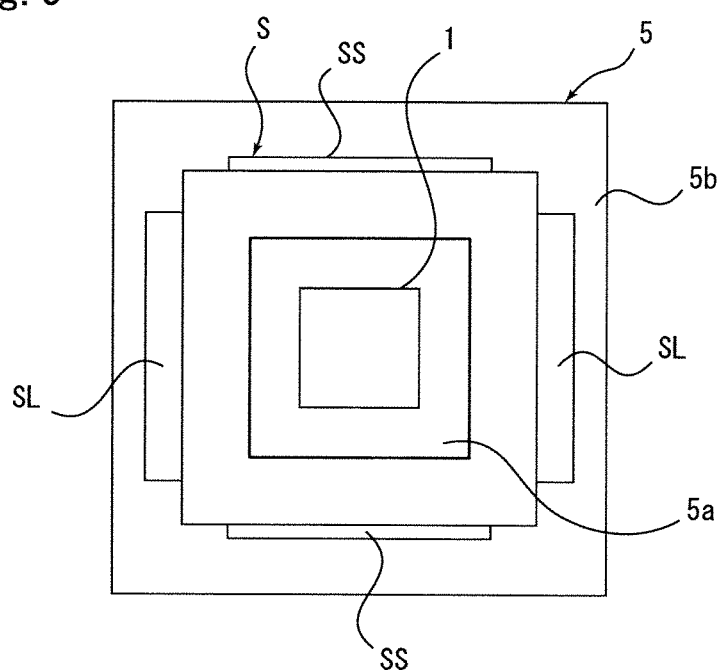
FIG. 5 is a diagram for explaining the arrangement of spray apertures in a fourth embodiment.

The spray apertures in the bonding apparatus 3 of the fourth embodiment illustrated in FIG. 5 includes four slits S provided along the holding section 5a, similarly to the second embodiment.

The present embodiment is provided with two wide slits SL in relation to the second embodiment, in which the wide slits SL are provided at positions facing each other across the holding section 5a, and the narrow slits SS are provided at positions orthogonal to the wide slits SL.

By adopting such a configuration, the inert gas sprayed from the wide slits SL provided at facing positions flows between the semiconductor chip 1 and the substrate 2 and then flows toward the narrow slits SS, and therefore the air between the semiconductor chip 1 and the substrate 2 can be replaced by the inert gas at a high level.

Note that in the fourth embodiment, the slits S may also be connected in an endless shape to form the air curtain C in an uninterrupted way, like the third embodiment in relation to the second embodiment.

Figure 6:
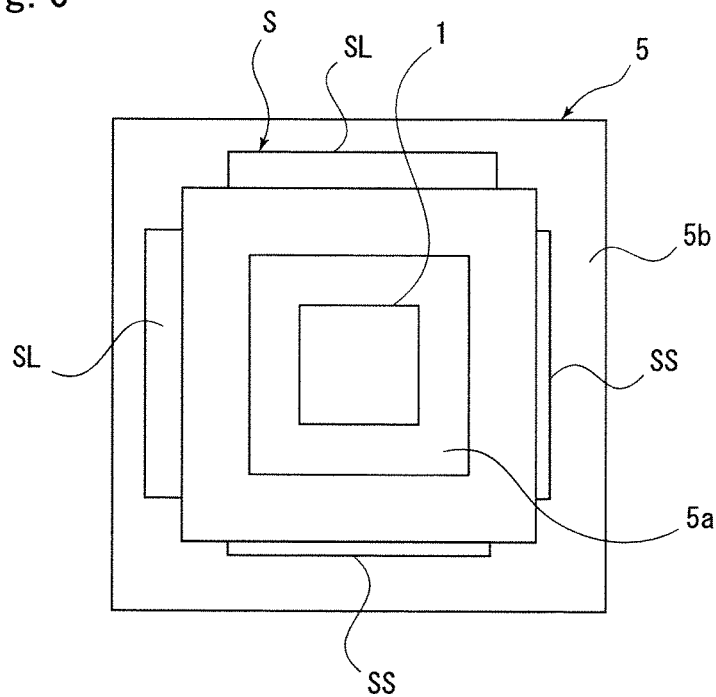
FIG. 6 is a diagram for explaining the arrangement of spray apertures in a fifth embodiment.

The bonding apparatus 3 of the fifth embodiment illustrated in FIG. 6 includes four slits S provided along the holding section 5a, similarly to the second embodiment.

The present embodiment is provided with two wide slits SL similarly to the fourth embodiment, but in the present embodiment, the wide slits SL are provided on two adjacent edges of the holding section 5a, while the narrow slits SS are provided on the two adjacent edges facing opposite across the center of the holding section 5a.

By adopting such a configuration, the inert gas sprayed from the wide slits SL provided on adjacent edges flows between the semiconductor chip 1 and the substrate 2 and then flows toward the narrow slits SS on the two opposite edges, and therefore the air between the semiconductor chip 1 and the substrate 2 can be replaced by the inert gas at a high level.

Note that in the fifth embodiment, the slits S may also be connected in an endless shape to form the air curtain C in an uninterrupted way, like the third embodiment in relation to the second embodiment.

Figure 7:
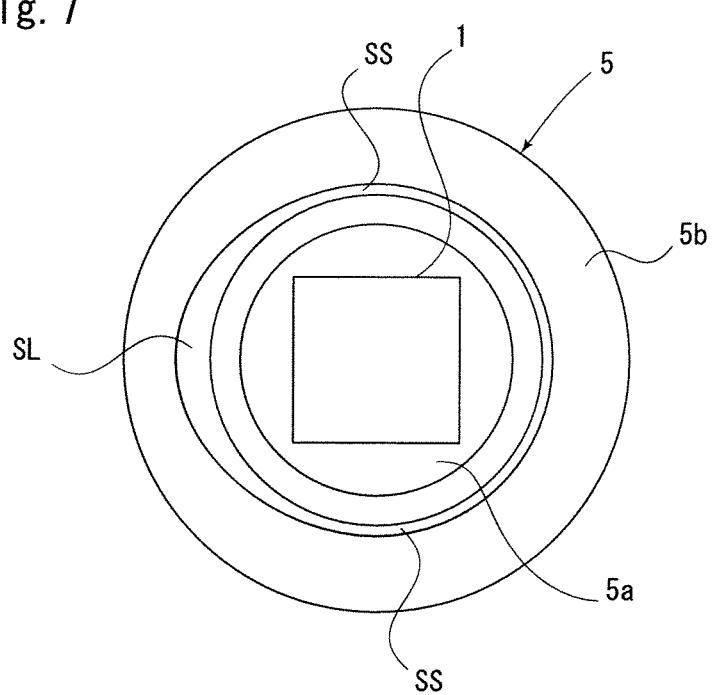
FIG. 7 is a diagram for explaining the arrangement of spray apertures in a sixth embodiment.

In the bonding apparatus 3 of the sixth embodiment illustrated in FIG. 7, the holding section 5a is circular and holds the semiconductor chip 1 by suction in the central portion thereof. Also, the spray aperture includes a circular slit S surrounding the holding section 5a in an endless shape.

Furthermore, in the present embodiment, a portion of the slit is a wide slit SL that is wider than another portion and the other portion is a narrow slit SS, and the slit S is formed such that the width changes gradually between the wide slit SL and the narrow slit SS.

The wide slit SL is formed in a length ratio of approximately 20% to 25% with respect to the full circumference of the slit S, and by adopting such a configuration, the inert gas sprayed from the wide slit SL can pass between the semiconductor chip 1 and the substrate 2, and the interposed air can be replaced by the inert gas at a high level.

In the embodiments described above, the spray apertures include slits S formed between the holder 13 forming the holding section 5a and the frame 16 forming the spraying unit 5b, and by varying the widths of the slits S, the wide slit(s) SL is configured as a large spray aperture and the narrow slits SS are configured as small spray aperture.

In contrast, even if the widths of the slits S are all set to the same width, a configuration other than the above configurations can be adopted by causing the inert gas to be sprayed from a certain slit S at a spray flow rate different from the other slits S.

For example, by causing the gas supplying unit 17 to supply the inert gas at a high flow rate to a certain slit S, the certain slit S can be configured as a large spray aperture, and by supplying the inert gas at a lower flow rate to the other slits S, the other slits S can be configured as small spray apertures.

Also, by configuring the shape of the spray apertures into plurality of spray nozzles provided along the holding section 5a instead of the slits S, and causing the inert gas to be sprayed at a different spray flow rate from a certain spray nozzle, each spray nozzle can be configured as a large spray aperture or a small spray aperture.

Even in the above case, by arranging the large spray apertures and the small spray apertures as illustrated in the various embodiments, the air curtain C can be formed around the bonding portion between the semiconductor chip 1 and the substrate 2, a flow of the inert gas can be formed between the semiconductor chip 1 and the substrate 2, and the air located in between can be replaced at a high level.

What is claimed is:

1. A bonding apparatus comprising:
   a bonding stage that holds a substrate;
   a bonding held provided with a holding section that holds a semiconductor chip;
   a gas supplying unit;
   a spray aperture provided adjacent to and surrounding the holding section of the bonding head, the gas supplying unit causing an inert gas to be sprayed from the spray aperture, a portion of the spray aperture being a large spray aperture and another portion of the spray aperture being a small spray aperture, the large spray aperture being set to a larger jet flow rate of the inert gas than the small spray aperture, the inert gas sprayed from the large spray aperture and the small spray aperture forming an air curtain that surrounds a bonding portion between the semiconductor chip and the substrate, the inert gas sprayed from the large spray aperture forming a flow that passes between the semiconductor chip and the substrate; and
   a suction surface that holds the semiconductor chip by suction on the holding section of the bonding head, the holding section being formed into an approximately square shape with four edges, the spray aperture comprises four slits provided along the four edges of the holding section, respectively, and one or two of the slits form the large spray aperture.

2. The bonding apparatus according to claim 1, wherein the spray aperture has an endless shape and surrounds the holding section of the bonding head.

3. The bonding apparatus according to claim 1, wherein the four slits are provided in the bonding head, the one or two slits form the large spray aperture and two or three of the remaining slits form the small spray aperture, the large spray aperture having a greater width than the small spray aperture.

* * * * *